(12) United States Patent
Zhang et al.

(10) Patent No.: US 10,720,791 B2
(45) Date of Patent: Jul. 21, 2020

(54) CHARGING METHOD, CHARGING DEVICE AND TERMINAL

(71) Applicant: GUANGDONG OPPO MOBILE TELECOMMUNICATIONS CORP., LTD., Dongguan (CN)

(72) Inventors: Qiang Zhang, Dongguan (CN); Fanhong Kong, Dongguan (CN); Fuchun Liao, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 441 days.

(21) Appl. No.: 15/802,147

(22) Filed: Nov. 2, 2017

(65) Prior Publication Data
US 2018/0205261 A1 Jul. 19, 2018

(30) Foreign Application Priority Data

Jan. 13, 2017 (CN) .......................... 2017 1 0026437

(51) Int. Cl.
H02J 7/04 (2006.01)
G01R 31/382 (2019.01)
H01M 10/44 (2006.01)
H02J 7/00 (2006.01)
G01R 31/44 (2020.01)
G01R 31/36 (2020.01)

(52) U.S. Cl.
CPC ............ *H02J 7/045* (2013.01); *G01R 31/382* (2019.01); *G01R 31/44* (2013.01); *H01M 10/44* (2013.01); *H02J 7/007* (2013.01); *G01R 31/3648* (2013.01)

(58) Field of Classification Search
CPC .......................... G01R 31/3832; H02J 7/0071
See application file for complete search history.

(56) References Cited

U.S. PATENT DOCUMENTS

2012/0130661 A1* 5/2012 Hagimori ........... G01R 31/3842
702/63
2014/0167774 A1 6/2014 Yagura et al.

FOREIGN PATENT DOCUMENTS

| CN | 101436690 A | 5/2009 |
|---|---|---|
| CN | 103730915 A | 4/2014 |
| CN | 104112878 A | 10/2014 |
| CN | 105207281 A | 12/2015 |
| CN | 105322591 A | 2/2016 |

(Continued)

OTHER PUBLICATIONS

Machine translation of WO-2010066154-A1 (Year: 2020).*

(Continued)

*Primary Examiner* — David V Henze-Gongola
(74) *Attorney, Agent, or Firm* — Lathrop GPM LLP

(57) ABSTRACT

Embodiments of the present disclosure provide a charging method, a charging device and a terminal. According to the embodiments of the present disclosure, a current battery voltage of a battery of a terminal is obtained. A current remaining electric quantity of the battery is obtained according to the current battery voltage. A charging duration of the battery at each charging stage is obtained according to the remaining electric quantity. The battery is charged according to the charging duration of the battery at each charging stage. This solution can increase a charging speed of the terminal.

12 Claims, 5 Drawing Sheets

(56) References Cited

FOREIGN PATENT DOCUMENTS

| | | | |
|---|---|---|---|
| CN | 105680521 A | 6/2016 | |
| CN | 106655398 A | 5/2017 | |
| WO | WO-2010066154 A1 * | 6/2010 | ............ H01M 10/44 |
| WO | WO 2010066154 A1 | 6/2010 | |

OTHER PUBLICATIONS

European Patent Application No. 17199844.6 extended Search and Opinion dated May 25, 2018, 8 pages.
Chinese Patent Application No. 201710026437.6, English translation of Office Action dated Jun. 26, 2018, 7 pages.
Chinese Patent Application No. 201710026437.6, Office Action dated Jun. 26, 2018, 6 pages.
PCT/CN2017/108503 English translation of International Search Report and Written Opinion dated Jan. 29, 2018, 13 pages.

* cited by examiner

CHARGING METHOD, CHARGING DEVICE AND TERMINAL

CROSS REFERENCE TO RELATED APPLICATION

This application is based upon and claims priority and benefits of Chinese Patent Application No. 201710026437.6, filed with State Intellectual Property Office on Jan. 13, 2017, the entire content of which is incorporated herein by reference.

FIELD

The present disclosure relates to the terminal charging technology field, and more particularly, to a charging method, a charging device and a terminal.

BACKGROUND

At present, terminals (such as mobile phones, tablet computers) have become an indispensable part of people's lives and work. How to charge a battery of the terminal has been increasingly emphasized. A charging speed is as an important indicator of a quality of the terminal.

Currently, the battery of the terminal is charged generally through an adapter (or a charger). When the battery needs to be charged, the terminal is coupled to the adapter through charging wires. Presently, a process of charging the battery has several stages, such as a pre-charging stage and a constant-current charging stage. Therefore, in the process of charging the battery, it is required to detect a battery voltage in real time and compare the battery voltage with a cut-off voltage of the corresponding charging stage, so as to determine whether the charging is cut off in this stage, and then a next charging stage is entered when the charging is cut off in this stage.

Since charging methods in the related art need to detect the battery voltage constantly and to compare the battery voltage with the cut-off voltage during the charging process, thereby increasing a charging complexity, and decreasing a charging speed.

SUMMARY

Embodiments of the present disclosure provide a charging method, including:

obtaining a current battery voltage of a battery of a terminal;

obtaining a current remaining electric quantity of the battery according to the current battery voltage;

obtaining a charging duration of the battery at each charging stage according to the remaining electric quantity; and charging the battery according to the charging duration of the battery at each charging stage.

Correspondingly, embodiments of the present disclosure provide a terminal, including a memory, a processor and a computer program stored on the memory and executable by the processor. When executing the computer program, the processor is configured to implement the method described above.

Correspondingly, embodiments of the present disclosure provide a non-transitory computer-readable storage medium having stored therein instructions that, when executed by a processor of a terminal, causes the terminal to perform the method described above.

BRIEF DESCRIPTION OF THE DRAWINGS

In order to more clearly illustrate the technical solution in the embodiments of the present disclosure, the drawings, which are intended to be used in the following description of the embodiments, will be briefly described. It will be appreciated that the drawings in the following description are merely exemplary of embodiments of the present disclosure, and other drawings may be obtained from these drawings by those skilled in the art without inventive work.

DETAILED DESCRIPTION

Technical solutions in embodiments of the present disclosure are hereinafter described clearly and completely with reference to accompanying drawings in embodiments of the present disclosure. Apparently, embodiments described are a part of embodiments of the present disclosure, but not all embodiments. All other embodiments obtained by those skilled in the art based on the embodiments in the present disclosure without creative labor are within the protection scope of the present disclosure.

The terms in descriptions, claims and drawings such as "first," "second", "third" and "fourth" are used to distinguish different objects, and are not used to describe a particular order. In addition, terms such as "comprising", "containing" and any variations thereof are intended to cover non-exclusive inclusion. For example, it includes a series of processes, methods, systems, products, or devices of steps or modules, and is not limited to the listed steps or modules, alternatively, it also includes steps or modules that are not listed, and alternatively, it also includes other steps or modules inherent to the processes, methods, products or devices.

Reference throughout this specification to "an embodiment" means that a particular feature, structure, or characteristic described in connection with the embodiment is included in at least one embodiment of the present disclosure. In the present specification, the appearances of the above terms are not necessarily referring to the same embodiment of the present disclosure, and are not independent or alternative embodiments that are exclusive with other embodiments. It will be apparent to those skilled in the art that the embodiments described herein can be combined with other embodiments.

Execution bodies of a charging method provided in embodiments of the present disclosure may be a charging device provided in embodiments of the present disclosure, or a terminal integrated with the charging device. The charging device may be implemented by hardware or software or a combination thereof. According to embodiments of the present disclosure, the terminal may be a mobile phone (such as an android mobile phone, or a windows mobile phone), a tablet computer, a palmtop computer, a laptop computer or a mobile internet device. The terminals described above are only examples and are not exhaustive, which include but are not limited to the above described.

Embodiments of the present disclosure provide a charging method, a charging device and a terminal, which will be respectively described in detail below.

Figure 1:
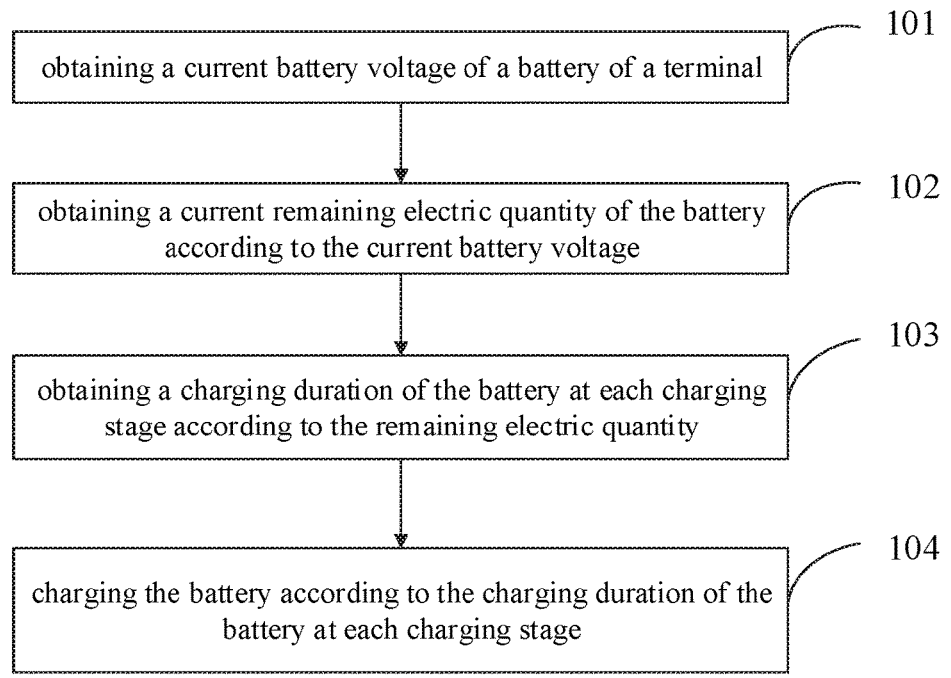
FIG. 1 is a flow chart illustrating a charging method according to an embodiment of the present disclosure.

In at least one embodiment, a charging method is provided. As illustrated in FIG. 1, the charging method may include the following.

At block 101, a current battery voltage of a battery of a terminal is obtained.

For example, when it is detected that the terminal is coupled to an adapter, the current battery voltage of the battery of the terminal is obtained.

In this embodiment, the current battery voltage of the battery can be collected through a charging chip. At this point, the battery voltage can be a voltage cross the battery and collected by the charging chip.

At block 102, a current remaining electric quantity of the battery is obtained according to the current battery voltage.

The remaining electric quantity is a current electric quantity remained in the battery of the terminal. That is, a current capacity remained in the battery.

In this embodiment, a capacity of the battery may be an electric quantity that can be discharged by the battery under certain conditions (discharge rate, temperature, and cut-off discharge voltage), and usually in ampere per hour (A·H for short, 1 A·h=3600 C).

In detail, "obtaining the current remaining electric quantity of the battery according to the current battery voltage" may include the following.

The current remaining electric quantity of the battery is obtained according to the battery voltage and a set of relationships between battery voltages and electric quantities. The set includes mapping relationships between the battery voltages and the remaining electric quantities.

The set may be expressed in multiple forms, such as, in a table. At this point, the current remaining electric quantity can be obtained according to the battery voltage and the set.

For example, the capacity of the battery is 1000 mAh, please refer to the following table.

| battery voltage | remaining electric quantity |
| --- | --- |
| 2 v | 300 mAh |
| 3 v | 615 mAh |
| 4.2 v | 982 mAh |

For example, when the battery voltage is 3 v, it can be found from the above table that the remaining electric quantity of the battery is 615 mAh.

At block 103, a charging duration of the battery at each charging stage is obtained according to the remaining electric quantity.

Figure 2:
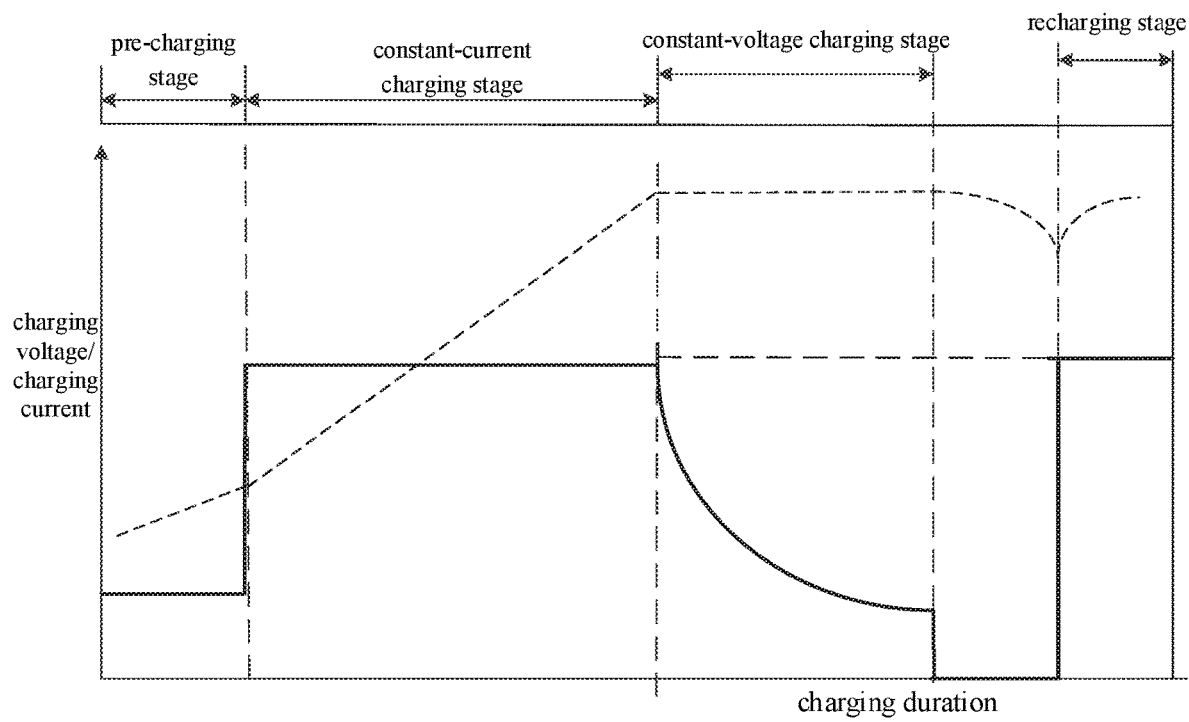
FIG. 2 is a schematic diagram illustrating charging stages according to an embodiment of the present disclosure.

With reference to FIG. 2, in this embodiment, the charging stages of the battery include a pre-charging stage, a constant-current charging stage and a constant-voltage charging stage.

The pre-charging stage, also known as a trickle-current charging stage, is configured to pre-charge a thoroughly discharged battery (i.e. recovery charging). The trickle-current charging is generally performed when the battery voltage is lower than a certain voltage value, such as about 3V. A charging current of the trickle-current charging is one-tenth of a charging current of the constant-current charging (for example, when the charging current of the constant-current charging is 1 A, the charging current of the trickle-current charging is 100 mA).

The constant-current charging stage is configured to increase the charging current for charging the battery with the constant current when the battery voltage rises above a trickle-current charging threshold. The charging current of the constant-current charging is between 0.2 C and 1.0 C (C is represented as a current with reference to a normal capacity of the battery, in which when the capacity of the battery is 1000 mAh, 1 C represents a charging current of 1000 mA). The battery voltage increases with a process of the constant-current charging, and a battery voltage of a single battery is generally set to be 3.0-4.2V.

The constant-voltage charging stage is configured to be performed when the battery voltage rises to 4.2V and the constant-current charging is ended. According to a saturation degree of a cell of the battery, the charging current is gradually reduced from a maximum value as the charging process continues. When the charging current is reduced to 0.01 C, the charging process is considered to be ended.

In this embodiment, the charging duration of the battery at each charging stage can be estimated according to the remaining electric quantity. For example, a charging duration T1 at the pre-charging stage, a charging duration T2 at the constant-current charging stage, and a charging duration T3 at the constant-voltage charging stage may be obtained.

In detail, block "obtaining the charging duration of the battery at each charging stage according to the remaining electric quantity" may include the following.

A required electric quantity of the battery is obtained according to the remaining electric quantity and a capacity of the battery.

The charging duration of the battery at each charging stage is estimated according to the required electric quantity.

For example, when the remaining electric quantity is C1 and the capacity of the battery is C, the required electric quantity C2 can be obtained, in which, C2=C−C1. When the capacity of the battery C=1000 mAh and the remaining electric quantity C1=615 mAh, the required electric quantity C2=1000 mAh−615 mAh=385 mAh.

After the required electric quantity is obtained, the charging duration of the battery at each charging stage can be estimated according to the charging current. In detail, a corresponding task electric quantity (i.e. a corresponding electric quantity to be charged) can be assigned for each charging stage, and the charging duration at each charging stage can be calculated according to the task electric quantity and the charging current at this stage. That is, "estimating the charging duration of the battery at each charging stage according to the required electric quantity" may include the following.

A corresponding electric quantity to be charged is assigned for a charging stage according to the required electric quantity.

A charging current corresponding to the charging stage is obtained.

According to the electric quantity to be charged and the charging current, the charging duration of the battery at the charging stage is obtained.

For example, after the required electric quantity C2 is obtained, a corresponding electric quantity C21 to be charged may be assigned for the pre-charging stage, a corresponding electric quantity C22 to be charged may be assigned for the constant-current charging stage, and a corresponding electric quantity C23 to be charged may be assigned for the constant-voltage charging stage. Then, a charging current I1 corresponding to the pre-charging stage, a charging current I2 corresponding to the constant-current charging stage and a charging current I3 corresponding to the constant-voltage charging stage can be obtained. Finally, the charging duration at the charging stage can be calculated based on the electric quantity to be charged and the charging current. In detail, the charging duration can be calculated by a formula of T=C'/I, in which, T is the charging duration, C' is the electric quantity to be charged at the charging stage, and I is the charging current at the charging stage.

For example, the charging duration at the pre-charging stage may be calculated by a formula of T1=C21/I1, the charging duration at the constant-current charging stage may be calculated by a formula of T2=C22/I2, and the charging duration at the constant-voltage charging stage may be calculated by a formula of T3=C23/I3.

In this embodiment, there are multiple ways to assign the electric quantity to be charged for the charging stage.

For example, the electric quantity to be charged is assigned for the charging stage according to a cut-off voltage threshold corresponding to the charging stage and the current battery voltage. That is, "assigning the corresponding electric quantity to be charged for a charging stage according to the required electric quantity" may include the following.

A cut-off voltage threshold corresponding to the charging stage is obtained.

The corresponding electric quantity to be charged is assigned for the charging stage according to the cut-off voltage threshold, the battery voltage and the required electric quantity.

For example, the cut-off voltage threshold V1 of the charging stage can be obtained, and then a corresponding electric quantity C2n to be charged can be assigned for the charging stage according to the cut-off voltage threshold V1, the battery voltage V and the electric quantity C2.

In this embodiment, the electric quantity to be charged can be obtained according to the cut-off voltage threshold and the battery voltage, and then the electric quantity to be charged is assigned for the charging stage according to a ratio. That is, "assigning the corresponding electric quantity to be charged for the charging stage according to the cut-off voltage threshold, the battery voltage and the required electric quantity" may include the following.

A ratio for the electric quantities to be charged among each charging stage is obtained according to the cut-off voltage thresholds and the battery voltage.

The corresponding electric quantity to be charged is assigned for the charging stage according to the ratio and the required electric quantity.

For example, according to the cut-off voltage threshold V1 of the pre-charging stage, the cut-off voltage threshold V2 of the constant-current charging stage and the battery voltage V, the ratio among the pre-charging stage, the constant-current charging stage and the constant-voltage charging stage can be obtained, such as a:b:c. Then, the electric quantity to be charged at each charging stage can be calculated based on the ratio and the electric quantity C2.

In at least one embodiment, according to a mapping relationship among the cut-off voltage threshold, the battery voltage and the ratio, the ratio among each charging stage can be obtained. That is, "obtain the ratio for the electric quantities to be charged among each charging stage according to the cut-off voltage thresholds and the battery voltage" may include the following.

The ratio among each charging stage is obtained according to the cut-off voltage threshold, the battery voltage and a set of relationships for assigning electric quantities. The set of relationships for assigning electric quantities includes mapping relationships among the cut-off voltage threshold, the battery voltage and the ratio.

The set of relationships for assigning electric quantities can be presented in a table, which can be called a table of relationships for assigning electric quantities.

For example, the charging stages include the pre-charging stage, the constant-current charging stage and the constant-voltage charging stage, and please refer to the following table of relationships for assigning electric quantities.

| battery voltage | cut-off voltage threshold of pre-charging stage | cut-off voltage threshold of constant-current charging stage | ratio for electric quantities to be charged among pre-charging stage, constant-current charging stage and constant-voltage charging stage |
|---|---|---|---|
| Va | V11 | V21 | a1:b1:c1 |
| Vb | V12 | V22 | a2:b2:c2 |
| Vc | V13 | V23 | a3:b3:c3 |

For example, when the battery voltage is Vc, the cut-off voltage threshold of the pre-charging stage is V13 and the cut-off voltage threshold of the constant-current charging stage is V23, it can be found from the above table that the ratio for the electric quantities to be charged among the pre-charging stage, the constant-current charging stage and the constant-voltage charging stage is a3:b3:c3.

In this embodiment, the table of relationships for assigning electric quantities may be obtained after many tests.

At block 104, the battery is charged according to the charging duration of the battery at each charging stage.

In detail, the battery is charged according to a predetermined charging parameter value (current or voltage) corresponding to the charging stage based on the charging duration T corresponding to the charging stage.

Figure 3:
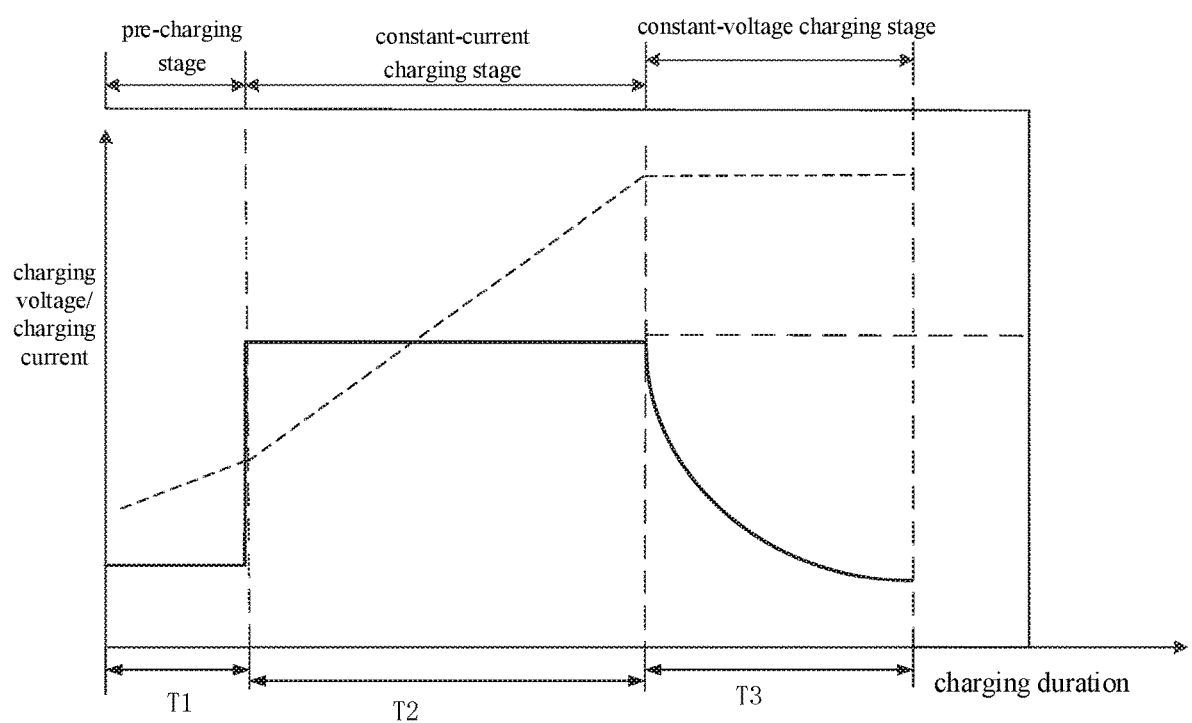
FIG. 3 is a schematic diagram illustrating a charging process based on charging durations according to an embodiment of the present disclosure.

For example, with reference to FIG. 3, after the charging duration T1 at the pre-charging stage, the charging duration T2 at the constant-current charging stage and the charging duration T3 at the constant-voltage charging stage are obtained, the battery can be charged for the duration T1 (at the pre-charging stage) using the predetermined current I1, then, the battery can be charged for the duration T2 using the predetermined current I2 (I2 is greater than I1), finally, the battery can be charged for the duration T3 using the predetermined voltage Vo.

As described above, according to embodiments of the present disclosure, the current battery voltage of the battery of the terminal is obtained; the current remaining electric quantity of the battery is obtained according to the current battery voltage; the charging duration of the battery at each charging stage is obtained according to the remaining electric quantity; and the battery is charged according to the charging duration of the battery at each charging stage. The solution can estimate the charging duration at each charging stage before charging, and then charge the battery based on the charging duration at each charging stage. It is not required to detect the battery voltage constantly and compare the battery voltage with the cut-off voltage during the charging process, thereby decreasing a charging complexity, increasing a charging speed, and saving resources of the terminal.

In at least one embodiment, for example, a terminal that integrates with a charging device may be used as an example to describe the charging method. The terminal can be a mobile phone, a tablet computer and the like.

Figure 4:
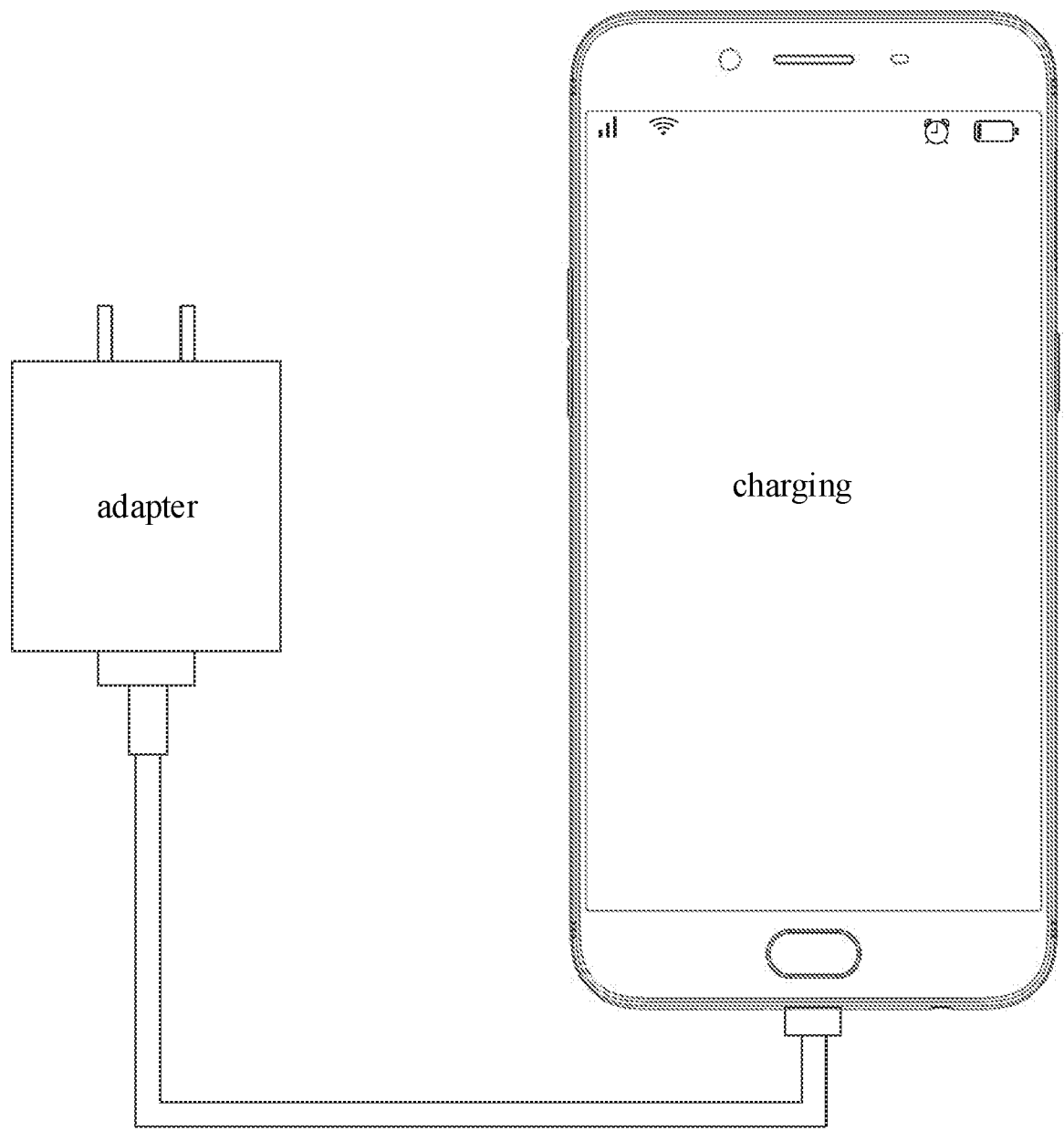
FIG. 4 is a schematic diagram illustrating a charging scene of a terminal according to an embodiment of the present disclosure.

With reference to FIG. 4, when the terminal is coupled the adapter, the charger starts to charge a battery of the terminal.

Figure 5:
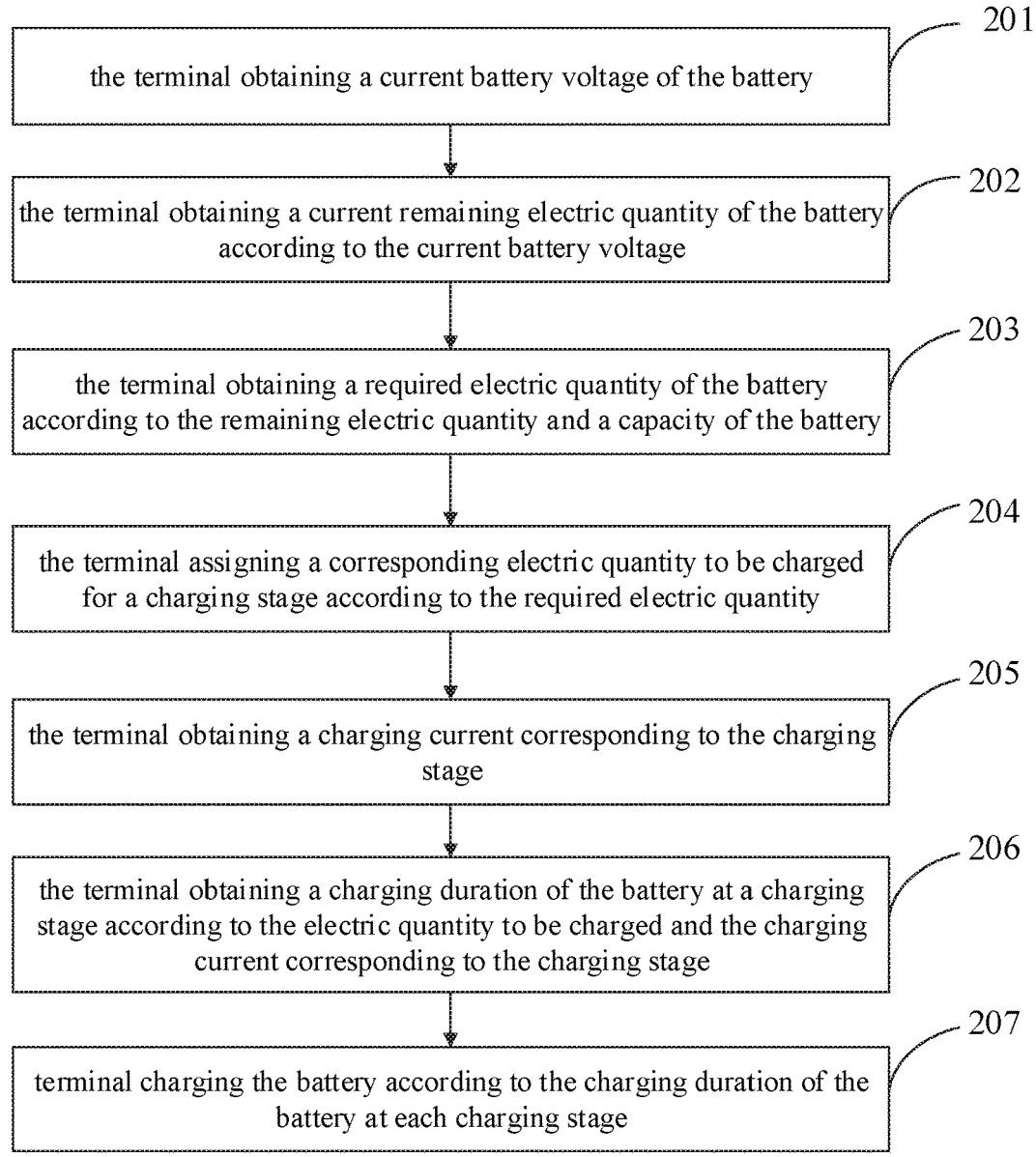
FIG. 5 is a flow chart illustrating a charging method according to another embodiment of the present disclosure.

With reference to FIG. 5, a detailed implementation process of the charging method in the embodiments of the present disclosure is as follows.

At block 201, the terminal obtains a current battery voltage of the battery.

When the terminal is coupled to the charger for charging, the current battery voltage Vbat is obtained. For example, the current battery voltage of the battery can be collected through the charging chip. At this point, the battery voltage Vbat can be a voltage across the battery and collected by the charging chip.

At block 202, the terminal obtains a current remaining electric quantity of the battery according to the current battery voltage.

For example, the terminal obtains the current remaining electric quantity C1 of the battery according to the current battery voltage Vbat.

The remaining electric quantity is a current electric quantity remained in the battery of the terminal. That is, a current capacity remained in the battery.

In this embodiment, a capacity of the battery may be an electric quantity discharged by the battery under certain conditions (discharge rate, temperature, and cut-off discharge voltage), and usually in ampere per hour (A·H for short, 1 A·h=3600 C).

The current remaining electric quantity of the battery is obtained by the terminal according to the battery voltage and a set of relationships between voltages and electric quantities, in which, the set includes mapping relationships between the voltages and the remaining electric quantities.

The set may be expressed in multiple forms, such as, in a table. At this point, the current remaining electric quantity can be obtained according to the battery voltage and the set.

At block 203, the terminal obtains a required electric quantity of the battery according to the remaining electric quantity and a capacity of the battery.

For example, the terminal obtains the required electric quantity C2=C−C1 according to the remaining electric quantity C1 and the capacity C of the battery. For example, the capacity of the battery C=1000 mAh, the remaining electric quantity C1=400 mAh, and then the required electric quantity C2=1000 mAh−400 mAh=600 mAh.

At block 204, the terminal assigns a corresponding electric quantity to be charged for a charging stage according to the required electric quantity.

For example, after the required electric quantity C2 is obtained, a corresponding electric quantity C21 to be charged may be assigned for the pre-charging stage, a corresponding electric quantity C22 to be charged may be assigned for the constant-current charging stage, and a corresponding electric quantity C23 to be charged may be assigned for the constant-voltage charging stage.

For example, the capacity C=1000 mAh of the battery, the remaining electric quantity C1=400 mAh, the corresponding electric quantity C21=20 mAh to be charged can be assigned for the pre-charging stage, the corresponding electric quantity C22=208 mAh to be charged can be assigned for the constant-current charging stage, and the corresponding electric quantity C23=300 mAh to be charged can be assigned for the constant-voltage charging stage.

In detail, the terminal obtains a cut-off voltage threshold corresponding to the charging stage, and assigns the corresponding electric quantity to be charged for the charging stage according to the cut-off voltage threshold, the battery voltage and the required electric quantity.

For example, the cut-off voltage threshold V1 of the charging stage can be obtained, and then the corresponding electric quantity C2n to be charged can be assigned for the charging stage according to the cut-off voltage threshold V1, the battery voltage V and the electric quantity C2.

For example, the terminal can obtain a ratio for the electric quantities to be charged among each charging stage according to the cut-off voltage threshold and the battery voltage, then, assign the corresponding electric quantity to be charged for the charging stage according to the ratio and the electric quantity.

At block 205, the terminal obtains a charging current corresponding to the charging stage.

For example, the charging current I1 corresponding to the pre-charging stage, the charging current I2 corresponding to the constant-current charging stage and the charging current I3 corresponding to the constant-voltage charging stage can be obtained.

In this embodiment, the charging current corresponding to the charging stage can be an average charging current. For example, the average charging current in the constant-voltage charging stage can be obtained.

For example, I1=100 mA, I2=500 mA, and I3=150 mA.

At block 206, the terminal obtains a charging duration of the battery at a charging stage according to the electric quantity to be charged and the charging current corresponding to the charging stage.

In detail, the terminal can calculate the charging duration according to a formula of T=C'/I, in which, C' is the electric quantity to be charged at the charging stage, I is the charging current at the charging stage, and T is the charging duration corresponding to the charging stage.

For example, the charging duration T1 at the pre-charging stage, the charging duration T2 at the constant-current charging stage, and the charging duration T3 at the constant-voltage charging stage may be calculated.

For example, the corresponding electric quantity C21=20 mAh to be charged is assigned for the pre-charging stage, the corresponding electric quantity C22=280 mAh to be charged is assigned for the constant-current charging stage, and the corresponding electric quantity C23=300 mAh to be charged is assigned for the constant-voltage charging stage. I1=100 mA, I2=500 mA, and I3=150 mA. At this point, it can be calculated that the charging duration T1=C21/I1=0.2 h=12 min at the pre-charging stage, the charging duration T2=C22/I2=0.56 h=33.6 min at the constant-current charging stage, and the charging duration T3=C23/I3=2 h at the constant-voltage charging stage.

At block 207, the terminal charges the battery according to the charging duration of the battery at each charging stage.

For example, the battery can be charged for the duration (at the pre-charging stage) T1 using the predetermined current I1. Then, the battery can be charged for the duration T2 using the predetermined current I2 (I2 is greater than I1). Finally, the battery can be charged for the duration T3 using the predetermined voltage Vo.

As described above, according to embodiments of the present disclosure, the current battery voltage of the battery of the terminal is obtained; the current remaining electric quantity of the battery is obtained according to the current battery voltage; the charging duration of the battery at each charging stage is obtained according to the remaining electric quantity; and the battery is charged according to the charging duration of the battery at each charging stage. The solution can estimate the charging duration at each charging stage before charging, and then charge the battery based on the charging duration at each charging stage. It is not required to detect the battery voltage constantly and compare the battery voltage with the cut-off voltage during the charging process, thereby decreasing a charging complexity, increasing a charging speed, and saving resources of the terminal.

In at least one embodiment, a charging device is also provided. The charging device can be integrated in a terminal. The terminal can be a personal computer (PC for short), a laptop computer, a smart phone or the like.

Figure 6:
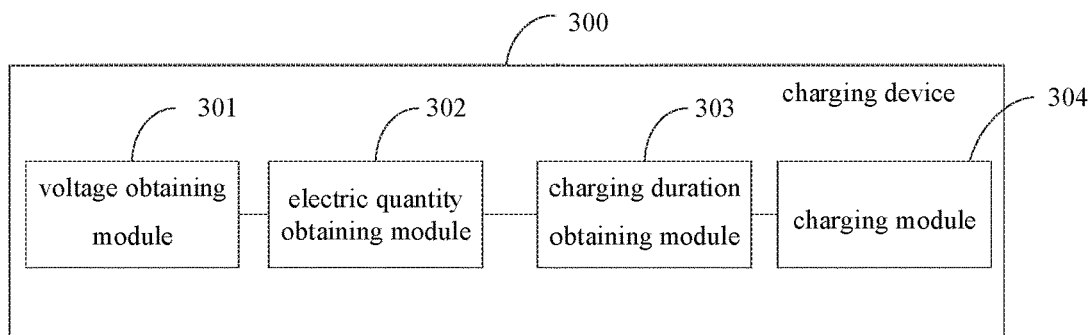
FIG. 6 is a block diagram illustrating a charging device according to an embodiment of the present disclosure.

As illustrated in FIG. 6, the charging device 300 includes a voltage obtaining module 301, an electric quantity obtaining module 302, a charging duration obtaining module 303 and a charging module 304.

The voltage obtaining module 301 is configured to obtain a current battery voltage of a battery of the terminal.

The electric quantity obtaining module 302 is configured to obtain a current remaining electric quantity of the battery according to the current battery voltage.

The charging duration obtaining module 303 is configured to obtain a charging duration of the battery at each charging stage according to the remaining electric quantity.

The charging module 304 is configured to charge the battery according to the charging duration of the battery at each charging stage.

Figure 7:
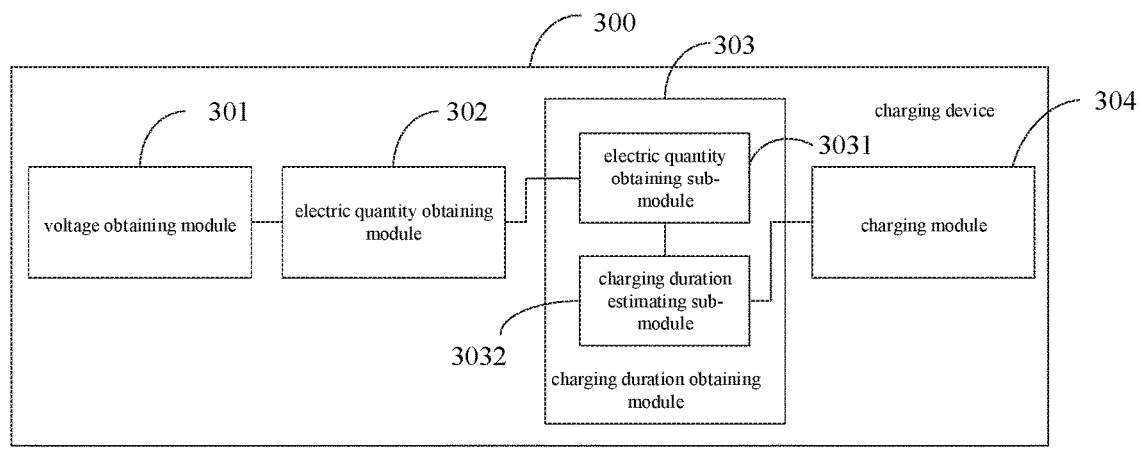
FIG. 7 is a block diagram illustrating a charging device according to another embodiment of the present disclosure.

With reference to FIG. 7, the charging duration obtaining module 303 includes an electric quantity obtaining sub-module 3031 and a charging duration estimating sub-module 3032.

The electric quantity obtaining sub-module 3031 is configured to obtain a required electric quantity of the battery according to the remaining electric quantity and a capacity of the battery.

The charging duration estimating sub-module 3032 is configured to estimate the charging duration of the battery at each charging stage according to the required electric quantity.

For example, the charging duration estimating sub-module 3032 is configured to: assign a corresponding electric quantity to be charged for a charging stage according to the required electric quantity; obtain a charging current corresponding to the charging stage; and obtain the charging duration of the battery at the charging stage according to the required electric quantity to be charged and the charging current.

For example, the charging duration estimating sub-module 3032 is configured to: obtain a cut-off voltage threshold corresponding to the charging stage; and assign the corresponding electric quantity to be charged for the charging stage according to the cut-off voltage threshold, the battery voltage and the required electric quantity.

The electric quantity obtaining module 302 is configured to: obtain the current remaining electric quantity of the battery according to the battery voltage and a set of relationships between battery voltages and electric quantities. The set includes mapping relationships between the battery voltages and the remaining electric quantities.

In implementations of the above, the above modules can be implemented as separate entities, or can also be implemented in any combination as a same entity or as a number of entities. The specific manners for performing operations for the individual module can refer to the embodiments regarding the methods, which will not be elaborated herein.

As described above, according to embodiments of the present disclosure, the voltage obtaining module 301 obtains the current battery voltage of the battery of the terminal; the electric quantity obtaining module 302 obtains the current remaining electric quantity of the battery according to the current battery voltage; the charging duration obtaining module 303 obtains the charging duration of the battery at each charging stage according to the remaining electric quantity; and the charging module 304 charges the battery according to the charging duration of the battery at each charging stage. The solution can estimate the charging duration at each charging stage before charging, and then charge the battery based on the charging duration at each charging stage. It is not required to detect the battery voltage constantly and compare the battery voltage with the cut-off voltage during the charging process, thereby decreasing a charging complexity, increasing a charging speed, and saving resources of the terminal.

In at least one embodiment, a terminal is further provided. The terminal includes a memory, a processor and a computer program stored on the memory and executable by the processor. When executing the computer program, the processor is configured to implement the charging method described above.

Figure 8:
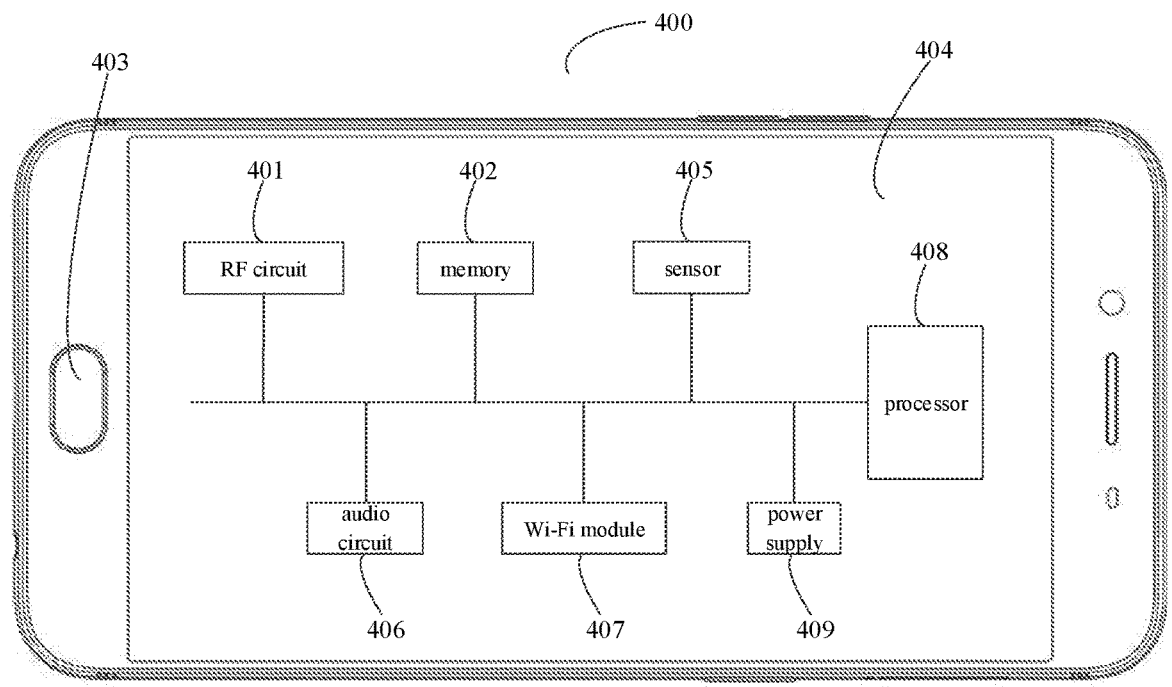
FIG. 8 is a block diagram illustrating a terminal according to an embodiment of the present disclosure.

With reference to FIG. 8, the terminal 400 may include a radio frequency (RF for short) circuit 401, a memory 402 including one or more computer-readable storage mediums, an input unit 403, a display unit 404, a sensor 405, an audio circuit 406, a wireless fidelity (Wi-Fi for short) module 407, a processor 408 including one or more processing cores, and a power supply 409. It will be understood by those skilled in the art that, the structure illustrated in FIG. 8 does not constitute a limitation on the terminal. Compared to the drawing illustrated, more or fewer components may be included, or a combination of some components or different component arrangements may also be possible.

The RF circuit 401 may be configured to receive and send messages, or receive and send signals during a call process. In detail, the RF circuit 401 receives a downlink message of a base station and delivers the message to the one or more processors 408 for processing, and sends uplink data to the base station.

The memory 402 may be configured to store software programs and modules. The processor 408 may execute various functional applications and data processing by running the application programs and modules stored in the memory 402. The memory 402 may mainly include a program storage area and a data storage area. The program storage area may store an operating system, an application program required by at least one function (such as a sound playback function and an image display function), and the like. The data storage area may store data (such as audio data, an address book, etc.) created according to the use of the terminal. In addition, the memory 402 may include a high-speed random access memory, and may also include a non-volatile memory such as at least one disk storage device, a flash memory device, or other volatile solid state memory device. Accordingly, the memory 402 may also include a memory controller to provide accesses to the memory 402 by the processor 408 and the input unit 403.

The input unit 403 may be configured to receive input digit or character information, and to generate a keyboard, a mouse, a joystick, an optical or trackball signal input related to user settings and function control. In detail, in a specific embodiment, the input unit 403 may include a touch-sensitive surface and other input device. The other input device may include, but be not limited to, one or more of a physical keyboards, a function keys (such as volume control keys, a switch keys, etc.), a trackballs, a mice, a joysticks, a fingerprint identification module and the like.

The display unit 404 may be configured to display information input by the user or information provided to the user and various graphical user interfaces of the terminal, in which the graphical user interface may be constructed from a graph, text, an icon, a video and any combination thereof. The display unit 404 may include a display panel. Alternatively, the display unit 404 may be configured in the form of a liquid crystal display (LCD), an organic light-emitting diode (OLED), or the like.

The terminal may also include at least one sensor 405, such as an optical sensor, a motion detector, and other sensors. In detail, the optical sensor may include an ambient light sensor and a proximity sensor. The ambient light sensor may adjust brightness of the display panel according to brightness of the ambient light. The proximity sensor may turn off the display panel and/or backlight when the terminal is moved to an ear.

The audio circuit 406 may provide audio interfaces between the user and the terminal through a loudspeaker or a microphone. The audio circuit 406 can convert received audio data into an electrical signal, and send the electrical signal to the loudspeaker. The loudspeaker converts the electrical signal into a sound signal and outputs. On the other hand, the microphone converts a collected sound signal into an electrical signal. The audio circuit 406 converts the electrical signal into audio data, and then outputs the audio data to the processor 408. After the audio data is processed by the processor 408, the RF circuit 401 may send it to another terminal, or outputs it to the memory 402 for further processing. The audio circuit 406 may also include a headset jack, so as to provide a communication between peripheral earphone and the terminal.

Wi-Fi belongs to a technology of short distance wireless transmission. One terminal may help users send and receive e-mails, browse webpages and access to streaming media through the Wi-Fi module 407. Wi-Fi provides the user with wireless broadband internet access.

The processor 408 is a control center of the terminal, and all the components in the entire terminal may be coupled to the processor 408 with various interfaces and wires. By running or executing the application programs stored in the memory 402, and invoking data stored in the memory 402, the processor 408 performs various functions and data processing of the terminal, thereby performing overall monitoring on the terminal. Optionally, the processor 408 may include one or more processing cores. Preferably, the processor 408 may integrate an application processor and a modem. The application processor mainly processes an operating system, a user interface, an application program, and the like. The modem mainly processes wireless communication. It may be understood that the foregoing modem may also not be integrated into the processor 408.

The terminal also includes a power supply 409 (such as a battery) that supplies power to each component. In at least one embodiment, the power supply may be logically coupled to the processor 408 through a power management system to enable functions such as charging management, discharging management and power consumption management through the power management system. The power supply 409 may also include any one or more components such as a direct-current or alternating-current power supply, a rechargeable system, a power fault detection circuit, a power converter or an inverter, a power status indicator and other components.

Although not illustrated, the terminal may also include a Bluetooth module and a camera, which will not be described in details here.

In an embodiment of the present disclosure, the processor 408 in the terminal loads the executable program codes corresponding to processes of one or more application programs into the memory 402 according to the following instructions, and the application programs stored in the memory 402 is executed by the processor 408, thus realising various functions.

The processor 408 is configured to: obtain a current battery voltage of a battery of a terminal; obtain a current remaining electric quantity of the battery according to the current battery voltage; obtain a charging duration of the battery at each charging stage according to the remaining electric quantity; and charge the battery according to the charging duration of the battery at each charging stage.

In at least one embodiment, obtaining a charging duration of the battery at each charging stage according to the remaining electric quantity includes: obtaining a required electric quantity of the battery according to the remaining electric quantity and a capacity of the battery, and estimating the charging duration of the battery at each charging stage according to the required electric quantity.

In at least one embodiment, estimating the charging duration of the battery at each charging stage according to the required electric quantity includes: assigning a corresponding electric quantity to be charged for a charging stage according to the electric quantity, obtaining a charging current corresponding to the charging stage, and obtaining the charging duration of the battery at the charging stage according to the electric quantity to be charged and the charging current.

In at least one embodiment, assigning a corresponding electric quantity to be charged for a charging stage according to the required electric quantity includes: obtaining a cut-off voltage threshold corresponding to the charging stage, and assigning the corresponding electric quantity to be charged for the charging stage according to the cut-off voltage threshold, the battery voltage and the required electric quantity.

In at least one embodiment, obtaining a current remaining electric quantity of the battery according to the current battery voltage includes: obtaining the current remaining electric quantity of the battery according to the battery voltage and a set of relationships between battery voltages and electric quantities. The set includes mapping relationships between the battery voltages and the remaining electric quantities.

As described above, embodiments of the present disclosure provide a terminal. The terminal can obtain a current battery voltage of a battery of the terminal, obtain a current remaining electric quantity of the battery according to the current battery voltage, obtain a charging duration of the battery at each charging stage according to the remaining electric quantity, and charge the battery according to the charging duration of the battery at each charging stage. The solution can estimate the charging duration at each charging stage before charging, and then charge the battery based on the charging duration at each charging stage. It is not required to detect the battery voltage constantly during the charging process and compare the battery voltage with the cut-off voltage, thereby decreasing a charging complexity, increasing a charging speed, and saving resources of the terminal.

It should be understood by those skilled in the art, a program may command the associated hardware to realize all or a portion of the various methods of the embodiments described above, and the program may be stored in computer readable storage medium. The above-mentioned storage medium may include a read-only memory (ROM), a random-access memory (RAM), a magnetic tape, a floppy disk, and the like.

Detailed description of the charging method, the charging device and the terminal provided in the embodiments of the present disclosure is made as above. Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A charging method, comprising:
   obtaining a current battery voltage of a battery of a terminal;
   obtaining a current remaining electric quantity of the battery according to the current battery voltage;
   obtaining a required electric quantity of the battery according to the remaining electric quantity and a capacity of the battery;
   estimating a charging duration of the battery at each charging stage according to the required electric quantity, comprising: assigning a corresponding electric quantity to be charged for a charging stage according to the required electric quantity, obtaining a charging current corresponding to the charging stage, and obtaining the charging duration of the battery at the charging stage according to the electric quantity to be charged and the charging current,
      wherein, assigning the corresponding electric quantity to be charged for the charging stage according to the required electric quantity comprises: obtaining a cut-off voltage threshold corresponding to the charging stage, obtaining a ratio for the electric quantities to be charged among each charging stage according to the cut-off voltage thresholds and the battery voltage, and assigning the corresponding electric quantity to be charged for the charging stage according to the ratio and the required electric quantity; and
   charging the battery according to the charging duration of the battery at each charging stage.

2. The charging method according to claim 1, wherein obtaining a ratio for the electric quantities to be charged among each charging stage according to the cut-off voltage thresholds and the battery voltage comprises:
   obtaining the ratio for the electric quantities to be charged among each charging stage according to the cut-off voltage threshold, the battery voltage and a set of relationships for assigning electric quantities, wherein the set of relationships for assigning electric quantities comprises mapping relationships among the cut-off voltage threshold, the battery voltage and the ratio.

3. The charging method according to claim 1, wherein obtaining a current battery voltage of a battery of a terminal comprises:
   obtaining the current battery voltage of the battery through a charging chip.

4. The charging method according to claim 1, wherein, obtaining a current remaining electric quantity of the battery according to the current battery voltage comprises:
   obtaining the current remaining electric quantity of the battery according to the battery voltage and a set of relationships between battery voltages and electric quantities, wherein, the set comprises mapping relationships between the battery voltages and the remaining electric quantities.

5. A terminal, comprising a memory, a processor, and a computer program stored on the memory and executable by the processor, when executing the computer program, the processor is configured to implement acts of:
   obtaining a current battery voltage of a battery of a terminal;
   obtaining a required electric quantity of the battery according to the remaining electric quantity and a capacity of the battery;
   estimating a charging duration of the battery at each charging stage according to the required electric quantity, comprising: assigning a corresponding electric quantity to be charged for a charging stage according to the required electric quantity, obtaining a charging current corresponding to the charging stage, and obtaining the charging duration of the battery at the charging stage according to the electric quantity to be charged and the charging current,
      wherein, assigning the corresponding electric quantity to be charged for the charging stage according to the required electric quantity comprises: obtaining a cut-off voltage threshold corresponding to the charging stage, obtaining a ratio for the electric quantities to be charged among each charging stage according to the cut-off voltage thresholds and the battery voltage, and assigning the corresponding electric quantity to be charged for the charging stage according to the ratio and the required electric quantity;
   obtaining a charging duration of the battery at each charging stage according to the remaining electric quantity; and
   charging the battery according to the charging duration of the battery at each charging stage.

6. The terminal according to claim 5, wherein the processor is configured to obtain a ratio for the electric quantities to be charged among each charging stage according to the cut-off voltage thresholds and the battery voltage by an act of:
   obtaining the ratio for the electric quantities to be charged among each charging stage according to the cut-off voltage threshold, the battery voltage and a set of relationships for assigning electric quantities, wherein the set of relationships for assigning electric quantities comprises mapping relationships among the cut-off voltage threshold, the battery voltage and the ratio.

7. The terminal according to claim 5, wherein the processor is configured to obtain a current battery voltage of a battery of a terminal by an act of:
   obtaining the current battery voltage of the battery through a charging chip.

8. The terminal according to claim 5, wherein the processor is configured to a current remaining electric quantity of the battery according to the current battery voltage by acts of:
   obtaining the current remaining electric quantity of the battery according to the battery voltage and a set of relationships between battery voltages and electric quantities, wherein, the set comprises mapping relationships between the battery voltages and the remaining electric quantities.

9. A non-transitory computer-readable storage medium having stored therein instructions that, when executed by a processor of a mobile terminal, causes the mobile terminal to perform a charging method, the charging method comprising:

obtaining a current battery voltage of a battery of a terminal;

obtaining a required electric quantity of the battery according to the remaining electric quantity and a capacity of the battery;

estimating a charging duration of the battery at each charging stage according to the required electric quantity, comprising: assigning a corresponding electric quantity to be charged for a charging stage according to the required electric quantity, obtaining a charging current corresponding to the charging stage, and obtaining the charging duration of the battery at the charging stage according to the electric quantity to be charged and the charging current, wherein, assigning the corresponding electric quantity to be charged for the charging stage according to the required electric quantity comprises: obtaining a cut-off voltage threshold corresponding to the charging stage, obtaining a ratio for the electric quantities to be charged among each charging stage according to the cut-off voltage thresholds and the battery voltage, and assigning the corresponding electric quantity to be charged for the charging stage according to the ratio and the required electric quantity;

obtaining a charging duration of the battery at each charging stage according to the remaining electric quantity; and charging the battery according to the charging duration of the battery at each charging stage.

10. The non-transitory computer-readable storage medium according to claim 9, wherein obtaining a ratio for the electric quantities to be charged among each charging stage according to the cut-off voltage thresholds and the battery voltage comprises:

obtaining the ratio for the electric quantities to be charged among each charging stage according to the cut-off voltage threshold, the battery voltage and a set of relationships for assigning electric quantities, wherein the set of relationships for assigning electric quantities comprises mapping relationships among the cut-off voltage threshold, the battery voltage and the ratio.

11. The non-transitory computer-readable storage medium according to claim 9, wherein obtaining a current battery voltage of a battery of a terminal comprises:

obtaining the current battery voltage of the battery through a charging chip.

12. The non-transitory computer-readable storage medium according to claim 9, wherein, obtaining a current remaining electric quantity of the battery according to the current battery voltage comprises:

obtaining the current remaining electric quantity of the battery according to the battery voltage and a set of relationships between battery voltages and electric quantities, wherein, the set comprises mapping relationships between the battery voltages and the remaining electric quantities.

\* \* \* \* \*